United States Patent [19]

Hikata et al.

[11] Patent Number: 5,639,714
[45] Date of Patent: Jun. 17, 1997

[54] METHOD OF PRODUCING OXIDE SUPERCONDUCTOR

[75] Inventors: Takeshi Hikata; Ken-ichi Sato; Hidehito Mukai; Nobuhiro Shibuta; Kazuya Ohmatsu; Masayuki Nagata; Satoshi Takano; Yoshikado Hosoda; Hajime Hitotsuyanagi; Maumi Kawashima, all of Osaka, Japan

[73] Assignee: Sumitomo Electric Industries, Ltd., Japan

[21] Appl. No.: 459,624

[22] Filed: Jun. 2, 1995

Related U.S. Application Data

[63] Continuation of Ser. No. 128,034, Sep. 27, 1993, abandoned, which is a continuation of Ser. No. 394,699, Aug. 16, 1989, abandoned.

[30] Foreign Application Priority Data

| Aug. 29, 1988 | [JP] | Japan | 63-214342 |
| Sep. 17, 1988 | [JP] | Japan | 63-233084 |
| Dec. 28, 1988 | [JP] | Japan | 63-334576 |
| Jan. 27, 1989 | [JP] | Japan | 1-18664 |
| Feb. 6, 1989 | [JP] | Japan | 1-28117 |
| Mar. 16, 1989 | [JP] | Japan | 1-65695 |
| Jun. 24, 1989 | [JP] | Japan | 1-162442 |
| Jun. 27, 1989 | [JP] | Japan | 1-164510 |

[51] Int. Cl.$^6$ ................................... H01L 39/24
[52] U.S. Cl. .................. 505/433; 29/599; 505/501; 505/740; 505/742
[58] Field of Search ................ 505/430, 432, 505/433, 500, 501, 725, 740, 742, 739, 782; 264/66; 423/263, 593, 604; 501/123; 502/340, 349, 353; 252/521; 29/599

[56] References Cited

U.S. PATENT DOCUMENTS

| 4,929,596 | 5/1990 | Meyer et al. | 29/599 |
| 4,952,554 | 8/1990 | Jin et al. | 29/599 |
| 5,004,722 | 4/1991 | Tallman | 29/599 |
| 5,026,683 | 6/1991 | Ohkawa | 29/599 |
| 5,030,616 | 7/1991 | Yamamoto et al. | 29/599 |
| 5,100,865 | 3/1992 | Yamamoto et al. | 29/599 X |
| 5,100,867 | 3/1992 | Gunzelmann et al. | 505/740 |

FOREIGN PATENT DOCUMENTS

| 0 281 444 | 9/1988 | European Pat. Off. . | |
| 0 290 331 | 9/1988 | European Pat. Off. . | |
| A302791 | 2/1989 | European Pat. Off. . | |
| 308326 | 3/1989 | European Pat. Off. | 505/739 |
| 321184 | 6/1989 | European Pat. Off. | 505/782 |
| 225524 | 9/1988 | Japan | 505/739 |
| 252310 | 10/1988 | Japan | 505/740 |
| 281318 | 11/1988 | Japan | 505/740 |
| 134820 | 5/1989 | Japan | 505/740 |
| 161621 | 6/1989 | Japan | 505/740 |
| 151107 | 6/1989 | Japan | 505/740 |

OTHER PUBLICATIONS

Kohno, et al, "Critical Current Density of Y—Ba—Cu Oxide Wires", Jap. Jr. of App. Phy., vol. 26, No. 10, Oct., 1987, pp. 1653–1656.

Oota, et al., "Superconductivity at 100K in Bi—Pb—Sr—Ca—Cu—O", Aug., 1988, Japanese Jr. of App. Phy., vol. 27, No. 8, pp. L1445–L1447.

(List continued on next page.)

*Primary Examiner*—Joseph M. Gorski
*Attorney, Agent, or Firm*—Pennie & Edmonds

[57] ABSTRACT

A method of producing a Bi-Pb-Sr-Ca-Cu oxide superconductor by thermally treating raw material comprises steps of performing first plastic deformation on the raw material, performing first heat treatment on the material being subjected to the first plastic deformation, performing second plastic deformation on the material being subjected to the first heat treatment, and performing second heat treatment on the material being subjected to the second plastic deformation.

17 Claims, 4 Drawing Sheets

OTHER PUBLICATIONS

Uno, et al., "Synthesis of Bi—Sr—Ca—Cu—O Superconductor by Vacuum Calcination Method", Jun., 1988, Japanese Jr. of App. Phy., vol. 27, No. 6, pp. L1013–L1014.

Mazaki, et al., "Two–Step Superconducting Transition of a Bi—Sr—Ca—Cu—O System", May, 1988, Jap. Jr. of App. Phy., vol. 27, No. 5, pp. L811–L813.

Yamada, et al., "Pb Introduction to the High–Tc Superconductor Bi—Sr—Ca—Cu—O", Jun., 1988, Jap. Jr. of App. Phy., vol. 27, No. 6, pp. L996–L998.

Sadakata, et al., "Fabrication and Superconducting Properties of High Tc Oxide Wire", Dec., 1987, MRS Proc., High Temp. Supercon., vol. 99, pp. 293–296.

Asano, et al., "Preparation of Highly Oriented Microstructure in the (Bi,Pb)–Sr—Ca—Cu—O Sintered Oxide Superconductor", Sep., 1988, vol. 27, No. 9, Jap. Jr. of App. Phy., pp. L1652–L1654.

Yanagisawa, et al., "Properties of Pb–Doped Bi—Sr—Ca—Cu—O Superconductors", Aug., 1988, Jap. Jr. of App. Phy., vol. 27, No. 8, pp. L1460–L1462.

Matsuda, et al., "Critical Current Density of Bi—Pb—Sr—Ca—Cu—O Superconducting Ceramics", Sep., 1988, Jap. Jr. of App. Phy., vol. 27, No. 9, pp. L1650–L1651.

Jin, S., et al., "High $T_c$ superconductors composite wire fabrication," Applied Physics Letters, vol. 51, No. 3, Jul. 20, 1987, pp. 203–204.

Sekine, H., et al., "Fabrication of Multifilamentary Y—Ba—Cu—O oxide superconductors," Applied Physics Letters, vol. 52, No. 26, Jun. 27, 1988, pp. 2261–2262.

Liu, H.K., et al., "Stabilization of 110 K Superconducting Phase in Bi—Sr—Ca—Cu—O Pb Sustitution," Physics C., vol. 157, No. 1, Jan. 1, 1989, p. 98–98.

Matsuda et al., "Superconducting Tape–Shaped Wire by $Y_1Ba_2Cu_3O_{7-\delta}$ with $J_c \approx 2000 A/cm^2$", Materials Research Society Symposium Proceedings, vol. 99 (1988), from symposium High–Temperature Superconductors, Nov. 30–Dec. 4, 1987, Boston, MA.

Sekine et al., "Studies On The Non Rare Earth Oxide Superconductors Fabricated By Sintering", IEEE Transactions on Magnetics, vol. 25, No. 2, Mar. 1989, pp. 2164–2167, from the 1988 Applied Superconductivity Conference, Aug. 21–25, 1988, San Francisco, CA.

Kawashima et al., "The Manufacturing Process and Properties Of The High $T_c$ Oxide Superconducting Wire", IEEE Transactions on Magnetics, vol. 25, No. 2, Mar. 1989, pp. 2168–2170, from the 1988 Applied Superconductivity Conference, Aug. 21–25, 1988, San Francisco, CA.

Whitlow et al., "Silver Encased High Temperature Superconductor Ribbons Produced By Rolling", IEEE Transactions on Magnetics, vol. 25, No. 2, Mar. 1989, pp. 2317–2319, from the 1988 Applied Superconductivity Conference, Aug. 21–25, 1988, San Francisco, CA.

Stolz et al., "Controlled Formation of Misfit Dislocations for Heteroepitaxial Growth of GaAs on (100) Si by Migration–Enhanced Epitaxy", Japanese Journal of Applied Physics, vol. 27, No. 6, Jun. 1988, pp. L1140–L1143.

Asano et al., "Preparation of Highly Oriented Microstructure in the (Bi, Pb)–Sr—Ca—Cu—O Sintered Oxide Superconductor", Japanese Journal of Applied Physics, vol. 27, No. 9, Sep. 1988, pp. L1652–L1654.

Tanaka et al., "Improvements in the Current Carrying Capacity in High–$T_c$ BiSrCaCuO Superconductors", Japanese Journal of Applied Physics, vol. 27, No. 9, Sep. 1988, pp. L1655–L1656.

2 SUPERCONDUCTING PHASE

1 NON-SUPERCONDUCTING PHASE

METHOD OF PRODUCING OXIDE SUPERCONDUCTOR

This is a continuation of application Ser. No. 08/128,034, filed Sep. 27, 1993, now abandoned, which is a continuation of application Ser. No. 07/394,699, filed Aug. 16, 1989, now abandoned.

BACKGROUND OF THE INVENTION

1. Field of the Invention

The present invention relates to a method of producing a Bi-Pb-Sr-Ca-Cu oxide superconductor, and more particularly, it relates to an improvement for attaining high critical current density.

2. Description of the Background Art

A specific material exhibits diamagnetism under a superconducting phenomenon such that no potential difference is developed although a finite stationary current flows in its interior.

This superconducting phenomenon is applied to an extremely wide range of fields such as that of electric power including MHD power generation, power transmission and magnetic energy storage and that of transportation including a magnetic levitation train and an electromagnetically thrust ship. Further, a high-sensitive sensor for a magnetic field, a high frequency, radiation or the like utilizing the superconducting phenomenon is applied to the field of measurement, and also superconductors are used in the field of nuclear magnetic resonance (NMR), π-meson remedy and a high energy physical experimental apparatus, while the superconducting phenomenon is also expected in the field of electronics, represented by the Josephson device, as a technique which can not only reduce power consumption but implement an element of extremely high-speed operation.

Superconductivity was until recently only observed under a very low temperature. Even $Nb_3Ge$, which has been referred to as that having the highest critical temperature $T_C$ of superconductivity within conventional superconducting materials, has an extremely low critical temperature of 23.2 K, and this value has been regarded as the limit critical temperature of superconduction for a long period of time.

Therefore, a superconducting material has been generally cooled to a temperature below the aforementioned critical temperature with liquid helium which boils at 4.2 K, in order to implement a superconducting phenomenon. However, such employment of liquid helium leads to technical and economic burdens due to cooling equipment including liquefaction equipment, to hinder implementation of the technique of superconductivity.

On the other hand, it has been recently reported that a composite oxide sintered body can show superconductivity at a high critical temperature, and development of the technique of superconduction is abruptly being prompted with a superconductor whose critical temperature is not very low. It has been reported and recognized that a Y-Ba-Cu-O material superconducts at 90 K while Bi-Sr-Ca-Cu-O and Bi-Pb-Sr-Ca-Cu-O materials superconduct at 110 K respectively.

Liquid nitrogen is relatively easily obtainable at a low cost, and in fact, development of the technique of superconduction has been greatly advanced with discovery of a superconducting material which operates at the temperature of liquid nitrogen.

However, not only the critical temperature but current density is an important matter of concern for a superconducting magnet, a wiring member for a device, a power cable or the like in practice, such that current density of at least 1000 $A/cm^2$ must be attained. When the superconductor is elongated, further, such current density must be substantially uniformly attained over the longitudinal direction of the elongated superconductor. The critical temperature can be increased by using a Bi superconductor or a superconductor containing Bi which is partially replaced by Pb in particular, while current density of such a Bi superconductor is 100 to 200 $A/cm^2$ at the most. In practice, however, the current density must be ten times or more, while such high current density must be substantially uniformly attained over the longitudinal direction of the elongated superconducting material.

SUMMARY OF THE INVENTION

An object of the present invention is to provide a method of producing an oxide superconductor which superconducts under a temperature of at least 100 K, by far exceeding the temperature of liquid nitrogen, while exhibiting high current density.

The present invention provides a method of producing an oxide superconductor of Bi-Pb-Sr-Ca-Cu by thermally treating raw material, which method comprises a step of performing first plastic deformation on the raw material, a step of performing first heat treatment on the material subjected to the first plastic deformation, a step of performing second plastic deformation on the material subjected to the first heat treatment and a step performing second heat treatment on the material subjected to the second plastic deformation.

Figure 1:
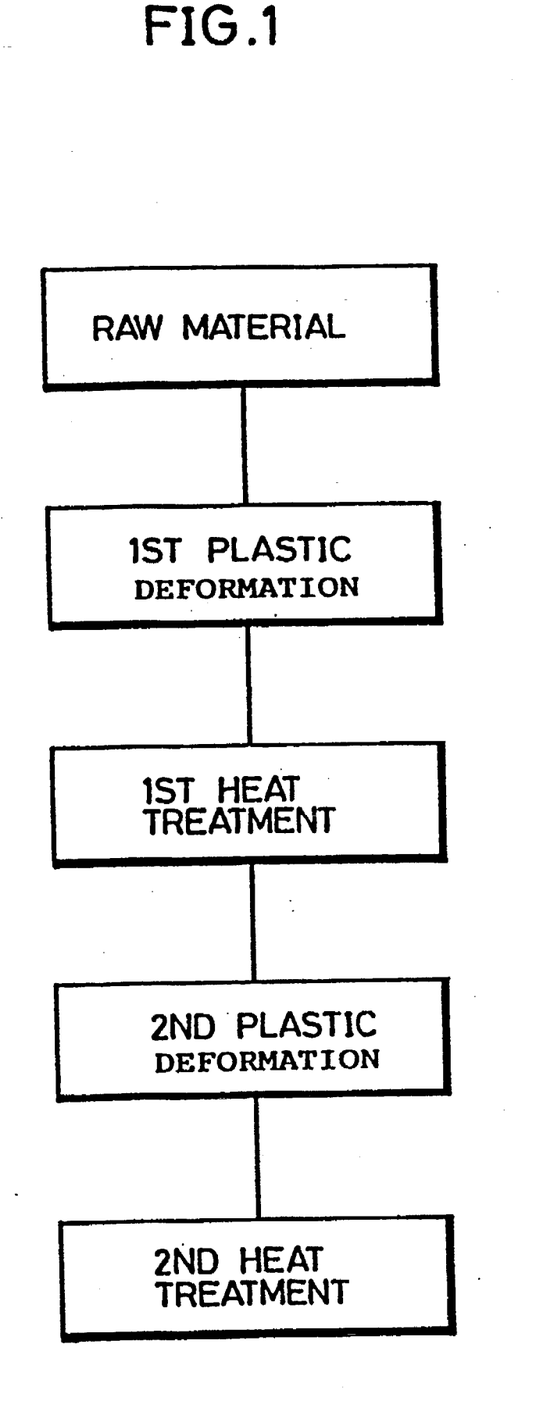
FIG. 1 is a flow chart showing the inventive producing method.

FIG. 1 is a flow chart showing the inventive producing method. According to the present invention, raw material is successively subjected to first plastic deformation, first heat treatment, second plastic deformation and second heat treatment as shown in FIG. 1.

According to the present invention, the second plastic deformation is performed after the first heat treatment, thereby to arrange orientation of superconducting phases generated by the first heat treatment. Then the second heat treatment is performed to strengthen bonding between the oriented superconducting phases, thereby to obtain an oxide superconductor having high critical current density.

According to the present invention, the raw material is preferably charged in a metal sheath to be subjected to the first plastic deformation, the first heat treatment, the second plastic deformation and the second heat treatment. However, it is not necessarily required to charge the raw material in the metal sheath. The first plastic deformation may be directly performed on raw material which is a compact of powder in a bulk state. Furthermore, the raw material may be sandwiched between metal plates. According to the present invention, the raw material may be mixed with metal powder or other oxide powder.

For example, the Bi-Pb-Sr-Ca-Cu oxide superconductor produced according to the present invention is composed of:

where x, y,, $z_1$, $z_2$ and $z_3$ represent numbers satisfying $0.2 \leq x \leq 0.8$, $1.5 \leq z_1$, $z_2$, $z_3 \leq 3.0$ and $2.5 \leq y \leq 4.5$, and oxygen.

More preferably, the inventive oxide superconductor is composed of:

where a, b, c, d and e represent numbers satisfying a+b:c:d:e=1.7 to 2.8:1.7 to 2.5:1.7 to 2.8:3, and oxygen.

According to the present invention, "raw material" includes not only powder obtained by mixing compounds containing respective elements to be in prescribed composition ratios but that prepared by calcinating and sintering such mixed powder for desired times and pulverizing the same.

Therefore, either raw material powder obtained by mixing compounds each containing at least one of the respective elements or that prepared from powder simultaneously containing the said elements can be employed. Such powder may be prepared from oxide, carbonate, sulfate, nitrate or oxalate, while a mixture thereof is also employable. The particle size may be several micrometers to 1 μm, or below 1 μm.

The metal sheath is preferably formed of silver or silver alloy, in view of permeation of oxygen and workability. However, the advantage effect of the present invention can be effectively obtained even if no metal sheath is employed or a different type of metal sheath is employed.

Examples of the first plastic deformation and the second plastic deformation performed in the present invention may be rolling, pressing, wire drawing and the like.

According to a first embodiment of the present invention, the second plastic deformation is at least 10% in reduction of area, while the first heat treatment and the second heat treatment are carried out within a temperature range of 780° to 860° C.

The first embodiment comprises a step of performing first plastic deformation on raw material, a step of performing first heat treatment on the material subjected to the first plastic deformation within a temperature range of 780° to 860° C., a step of performing second plastic deformation of at least 10% in reduction of area on the material subjected to the first heat treatment and a step of performing second heat treatment on the material subjected to the second plastic deformation within a temperature range of 780° to 860° C.

According to the first embodiment, reduction of sectional area of the second plastic deformation is preferably at least 20%.

For example, the oxide superconductor produced according to the first embodiment is composed of:

$$Bi_{2-x}Pb_xSr_2Ca_2Cu_y$$

where x and y represent numbers satisfying $0.2 \leq x \leq 0.8$ and $2.5 \leq y \leq 4.5$, and oxygen. Preferably x is around 0.4 and y is around 3. The heat treatment temperature, which depends on oxygen concentration of the atmosphere, is advantageously around 840° C. under normal atmospheric pressure.

According to the first embodiment, the plastic deformation of at least 10% in reduction of sectional area is inserted between the first heat treatment and the second heat treatment, thereby to increase denseness of superconducting phases and improve orientation property. Consequently, current density is extremely improved.

According to a second embodiment of the present invention, a load of at least 1 ton/cm² is applied in second plastic deformation while first heat treatment and second heat treatment are carried out within a temperature range of 780° to 860° C.

That is, the second embodiment comprises a step of performing first plastic deformation on raw material, a step of performing first heat treatment on the material subjected to the first plastic deformation within a temperature range of 780° to 860° C., a step of performing second plastic deformation by applying a load of at least 1 ton/cm² to the material subjected to the first heat treatment and a step of performing second heat treatment on the material subjected to the second plastic deformation within a temperature range of 780° to 860° C.

According to the second embodiment, the load of at least 1 ton/cm² is applied through the second plastic deformation, whereby superconducting phases are increased in denseness and the orientation property is improved while the degree of bonding in grain boundaries is improved to enable extreme improvement of current density.

For example, an oxide superconductor produced according to the second embodiment is composed of:

$$Bi_{z_1-x}Pb_xSr_{z_2}Ca_{z_3}Cu_y$$

where x, y, $z_1$, $z_2$ and $z_3$ represent numbers satisfying $0.2 \leq x \leq 0.8$, $1.5 \leq z_1$, $z_2$, $z_3 \leq 3.0$ and $2.5 \leq y \leq 4.5$, and oxygen. Preferably x is around 0.4, y is around 3, $z_1$ is around 1.9, $z_2$ is around 2 and $z_3$ is around 2.3. The heat treatment temperature, which depends on oxygen concentration in the atmosphere, is advantageously around 840° C. under normal atmospheric pressure.

An oxide superconductor produced according to the present invention was observed by SEM and EDX, to recognize that non-superconducting phases were finely dispersed along grain boundary portions of oriented superconducting phases. Thus, a superconductor exhibiting high critical current density was composed of:

$$Bi_aPb_bSr_cCa_dCu_e$$

where a, b, c, d and e represent numbers satisfying a+b:c:d:e=1.7 to 2.8:1.7 to 2.5:2.0 to 2.5:3 and a:b=3 to 9:1, and oxygen, while non-superconducting phases were dispersed along grain boundary portions of oriented superconducting phases.

In preferable composition ratios, a is around 1.8, b is around 0.4, c is around 2 and d is around 2.3.

Such a superconductor can be obtained by performing first plastic deformation on raw material prepared by mixing raw materials in the above composition ratios, performing first heat treatment on the raw material within a temperature range of 800° to 860° C., performing working with a load of at least 1 ton/cm² and performing second heat treatment within a temperature range of 780° to 860° C., for example. The superconductor thus obtained through heat treatment of two stages and plastic deformation contains oriented superconducting phases having a critical temperature of at least 100 K, while non-superconducting phases are dispersed along grain boundaries of the oriented superconducting phases.

According to a third embodiment of the present invention, raw material is prepared from powder which has been thermally treated to mainly generate superconducting phases having a low critical temperature, i.e. 80 K. That is, raw material is prepared from powder which has been thermally treated to mainly generate superconducting phases of a low critical temperature, to be subjected to first plastic deformation, first heat treatment, second plastic deformation and second heat treatment.

A superconductor produced according to the third embodiment is preferably composed of:

$$Bi_aPb_bSr_cCa_dCu_e$$

where a is around 1.8, b is around 0.4, c is around 2 and d is around 2.5, in the so-called 2223 composition. This 2223 composition is typical composition of a superconductor which has a critical temperature of 110 K.

According to the third embodiment, the raw material is preferably charged in a metal sheath.

In the third embodiment, the raw material, which is in composition capable of having a critical temperature of 110 K, is thermally treated to mainly generate superconducting phases having a critical temperature of 80 K. For example, when commercially available powder materials of $Bi_2O_3$, PbO, $SrCO_3$, $CaCO_3$ and CuO (99.9 to 99.99% in purity) of about 1 μm in particle size are subjected to heat treatment of calcination and sintering to prepare superconducting powder, calcination is performed at a temperature of 760° to 840° C. for 6 to 24 hours and sintering is performed at a temperature of 800° to 870° C. for 6 to 50 hours. Such heat treatment conditions are varied with the types of powder materials as employed and particle sizes thereof.

Such powder is charged in a metal sheath, preferably in that of silver or silver alloy, to be subjected to plastic deformation. The plastic deformation step may be carried out in any temperature range for cold, warm or hot working by a well-known plastic deformation method such as wire drawing, swaging, rolling or pressing.

In the third embodiment, the raw material is prepared by thermally treating to mainly generate superconducting phases having a critical temperature of 80 K for the following reason:

Noting the growth process of superconducting phases in sintering after or during working, it has been found that high-temperature phases of 110 K are grown in a worked longitudinal direction by growing low-temperature phases of 80 K, whereby not only the critical temperature exceeds 100 K as a whole but critical current density is improved. For example, it has been recognized through an experiment that a superconductor of high performance having a critical temperature of 103 to 106 K and critical current density (at 77.3 K) of at least 9000 $A/cm^2$ can be obtained.

According to a fourth embodiment of the present invention, first heat treatment is so performed as to generate superconducting phases having a high critical temperature of 110 K.

When such 110 K phases are generated by the first heat treatment, the generated 110 K phases can be arranged in orientation by subsequent second plastic deformation, while bonding between the 110 K phases thus arranged in orientation can be strengthened by second heat treatment. Consequently, an oxide superconductor having high critical current density can be obtained.

The aforementioned phenomenon has been experimentally confirmed by the inventors, and high current density cannot be obtained even if high-temperature phases are generated by the second heat treatment. In this case, however, it may be considered to generate phases having a high critical temperature by the second heat treatment to thereafter perform plastic deformation, and strengthen bonding by third heat treatment. Although such a method is undesirable since the steps are uselessly complicated, this idea conforms to the present invention. Therefore, even if phases having a high critical temperature are generated by second heat treatment to be thereafter subjected to plastic deformation and third heat treatment as hereinabove described in order to merely depart from the scope of the present invention, this must be interpreted as being within the scope of the present invention.

According to the fourth embodiment, the high temperature phases are generated by the first heat treatment, while it is preferable to increase the density as high as possible in this case. As to the plastic deformation, which may be performed by extrusion, swaging, forging, wire drawing, rolling or the like, rolling in the final stage is preferable and effective. A superconductor thus improved in density is subjected to heat treatment, to generate high temperature phases. At this time, the high temperature phases may not be completely arranged in orientation. In general, therefore, no high current density is obtained in this stage. It is possible to arrange a-b planes perpendicularly to directions where working stress acts on. However, bonding between crystal grains is still weak in this stage of the plastic deformation, and such bonding between the crystal grains can be strengthened by performing second heat treatment.

According to a fifth embodiment of the present invention, a material subjected to first heat treatment and second heat treatment is cooled at a rate of at least 100° C./h. within a temperature range of up to at least 300° C. In the fifth embodiment, the first heat treatment and the second heat treatment are preferably performed within a temperature range of 800° to 860° C. respectively.

It is particularly preferable that, after the first heat treatment and the second heat treatment, the material is cooled at a rate of at least 150° C./h. within a temperature range of up to about 500° C.

For example, a superconductor in the form of an elongated wire is generally stood in a furnace to be subjected to heat treatment, and in this case, it is preferable to forcibly cool the same by using a fan or renewing the atmosphere, thereby to control the cooling rate to the aforementioned value.

As to composition of the superconductor, bismuth and lead may be partially replaced by antimony.

Particularly in composition of $(Bi,Pb,Sb)_a Sr_b Ca_c Cu_d$, it is preferable that a=1.7 to 2.8, b=1.7 to 2.5, c=1.7 to 2.8 and d=3. Further, it is also preferable that Bi is around 1.8, Pb is around 0.4, Sr is around 2 and Ca is around 2.2. When Sb is added, the ratio of Sb to Bi is preferably 0.02 to 0.2:1.8 in consideration of improvement in current density.

When the superconductor is provided in the form of an elongated wire, the same is covered with a metal sheath, for example.

According to the fifth embodiment, the material is cooled after the heat treatment within the temperature range of up to at least 300° C. at a rate of at least 100° C./h. since the critical current density is reduced if the cooling rate after the heat treatment is smaller than the above. Although the reason for this is not yet completely ascertained, it may be considered that slow cooling prompts generation of different phases between grain boundaries etc., thereby to reduce the critical current density.

Such generation of the different phases is particularly remarkable at a temperature exceeding 500° C., and hence quick cooling is preferable within a high temperature range of the heat treatment temperature up to about 500° C. in view of improvement in performance.

According to a sixth embodiment of the present invention, raw material is prepared from powder which has been sintered under a decompressed atmosphere.

According to the sixth embodiment, preferably bismuth oxide superconductor which is based on the aforementioned 2223 composition is selected as the oxide superconductor.

Atmospheric air of about 1 Torr is employed for the decompressed atmosphere, and sintering under this decompressed atmosphere is preferably performed at a temperature of 720° to 850° C.

In advance of the aforementioned sintering under the decompressed atmosphere, the raw material is preferably sintered at a temperature lower than the sintering temperature under the decompressed atmosphere, and then sintered at a temperature higher than the temperature of sintering under the decompressed atmosphere.

The oxide superconductor sintered under the decompressed atmosphere according to the sixth embodiment has uniform crystal grains, and hardly contains impurities. Further, such an oxide superconductor generates uniform crystal grains by heat treatment in a later step.

As hereinabove described, it is preferable to charge raw material in a metal sheath, in order to perform first plastic deformation, first heat treatment, second plastic deformation and second heat treatment according to the present invention. Such a metal sheath is important for singularizing a bismuth oxide superconductor containing Pb in phase. It may be considered that the metal sheath is useful for making the superconductor in single phase since it prevents evaporation of Pb caused in heat treatment. Such a metal sheath is preferably prepared from a metal material which is unreactive with the oxide superconductor. In the case of the bismuth oxide superconductor, the metal sheath is preferably formed by a metal pipe of silver or silver alloy.

The raw material is thus charged in the metal sheath to be subjected to first plastic deformation, first heat treatment, second plastic deformation and second heat treatment, thereby to produce a Bi-Pb-Sr-Ca-Cu oxide superconductor mainly 110 K single phase. Thus, a temperature gap can be increased in the case of cooling the material with liquid nitrogen, thereby to obtain an oxide superconductor exhibiting high critical current density.

These and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE I

Example of a first embodiment of the present invention is now described.

Commercially available materials of $Bi_2O_3$ powder, PbO powder, $SrCO_3$ powder, $CaCO_3$ powder and CuO powder were mixed in the ratios 1.6:0.4:2:2:3. This mixture was pulverized, mixed, calcined at 800° C. for eight hours, subjected to heat treatment at 840° C. for 16 hours and charged in a silver pipe of 6 mm in inner diameter and 8 mm in outer diameter, to be drawn into a wire of 1 mm in diameter. This wire was worked into a tape, and subjected to heat treatment at 840° C. for 120 hours in the atmosphere.

Samples of such a wire were subjected to working with reduction of area shown in Table 1, and thereafter subjected to heat treatment at 840° C. for 40 hours.

Table 1 shows critical temperatures and current density at 77.3 K of oxide superconductors thus obtained.

TABLE 1

| No. | Reduction of Area (%) | Critical Temperature (K) | Current Density (A/cm$^2$) |
|---|---|---|---|
| 1 | 8 | 103 | 850 |
| 2 | 12 | 104 | 2240 |
| 3 | 22 | 104 | 3040 |
| 4 | 27 | 104 | 3240 |
| 5 | 33 | 104 | 4450 |
| 6 | 45 | 104 | 4420 |
| 7 | 68 | 103 | 4350 |

It is clearly understood from Table 1 that improvement in current density, which is considered to be due to improvement in denseness and improvement in orientation property, is attained by performing working with reduction of area of at least 10%, preferably of at least 20%, to effectively improve characteristics of the superconductor.

EXAMPLE II

Example of a second embodiment of the present invention is now described.

Commercially available materials of $Bi_2O_3$ powder, PbO powder, $SrCO_3$ powder, $CaCO_3$ powder and CuO powder were mixed so that Bi, Pb, Sr, Ca and Cu were in the ratios 1.8:0.4:2:2.3:3. This mixture was pulverized, mixed, calcined at 800° C. for eight hours, subjected to heat treatment at 840° C. for 16 hours and charged in a silver pipe of 6 mm in inner diameter and 8 mm in outer diameter, to be drawn into a wire of 1 mm in diameter. This wire was worked into a tape, and subjected to heat treatment at 840° C. for 120 hours in the atmosphere.

Samples of such Example were subjected to second plastic deformation with application of loads shown in Table 2, and thereafter subjected to second heat treatment at 840° C. for 40 hours.

Table 2 shows critical temperatures and current density at 77.3 K of oxide superconductors thus obtained.

TABLE 2

| No. | Load (ton/cm$^2$) | Critical Temperature (K) | Current Density (A/cm$^2$) |
|---|---|---|---|
| 1 | 0.5 | 103 | 1030 |
| 2 | 1 | 104 | 2110 |
| 3 | 2 | 104 | 3300 |
| 4 | 4 | 104 | 5300 |
| 5 | 10 | 104 | 8370 |
| 6 | 50 | 104 | 8200 |
| 7 | 100 | 103 | 8050 |

It is clearly understood from Table 2 that improvement in current density, which is considered to be due to improvement in denseness, improvement in orientation property and improvement in degree of adhesion between particles in grain boundaries, can be attained by application of a load of at least 1 ton/cm$^2$, preferably of at least 2 ton/cm$^2$, to effectively improve characteristics of the superconductor.

EXAMPLE III

Examples of superconductors obtained according to the second embodiment are now described.

EXAMPLE III-1

Oxides of Bi, Pb, Sr, Ca and Cu were mixed in the ratios 1.8:0.4:2:2:3. Such mixed powder was subjected to heat treatment twice at 800° C. and once at 860° C., and then pulverized. This powder was charged in an Ag pipe of 12 mm in outer diameter and 8 mm in inner diameter, and worked into a wire of 2 mm in diameter by swaging and drawing. Then this wire was worked into a tape of 0.5 mm in thickness, subjected to heat treatment at 840° C. for 100 hours, pressed under a pressure of 10 ton/cm² and subjected to heat treatment at 840° C. for 50 hours.

Critical current density ($J_C$) of the superconducting wire thus obtained was 12000 A/cm² at 77.3 K.

EXAMPLE III-2

Oxide powder materials of Bi, Pb, St, Ca and Cu were mixed in the ratios 1.6:0.4:2.0:1.8:3, to prepare a superconducting wire by a method similar to that in Example III-1. The critical current density $J_C$ of this superconducting wire was 4000 A/cm².

Figure 2:
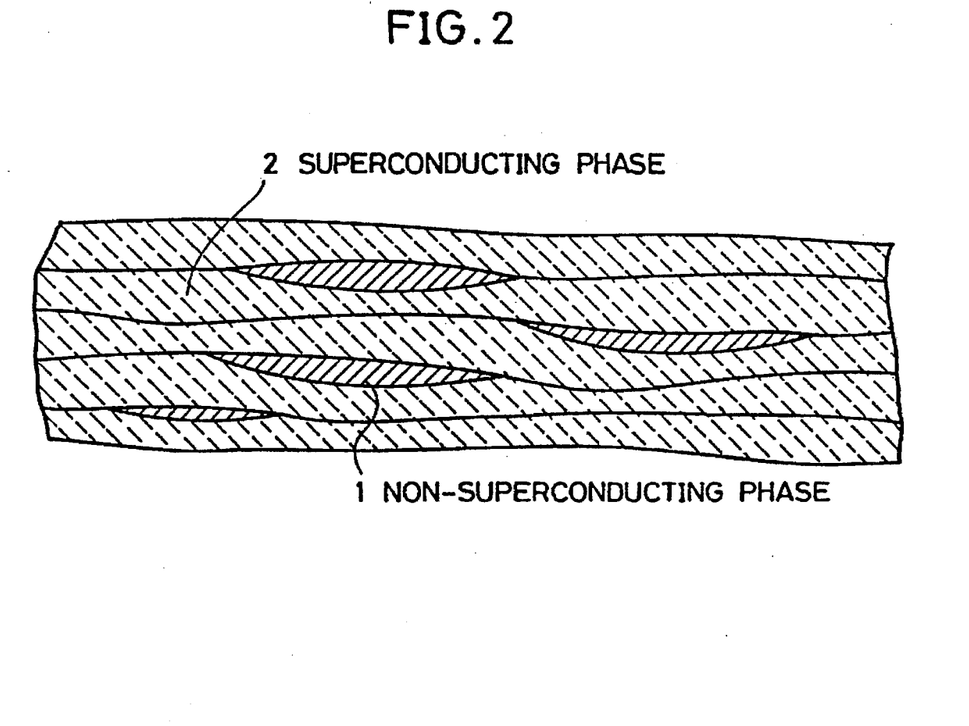
FIG. 2 typically illustrates states of superconducting phases and non-superconducting phases in a superconductor exhibiting high critical current density in Example III.
Figure 3:
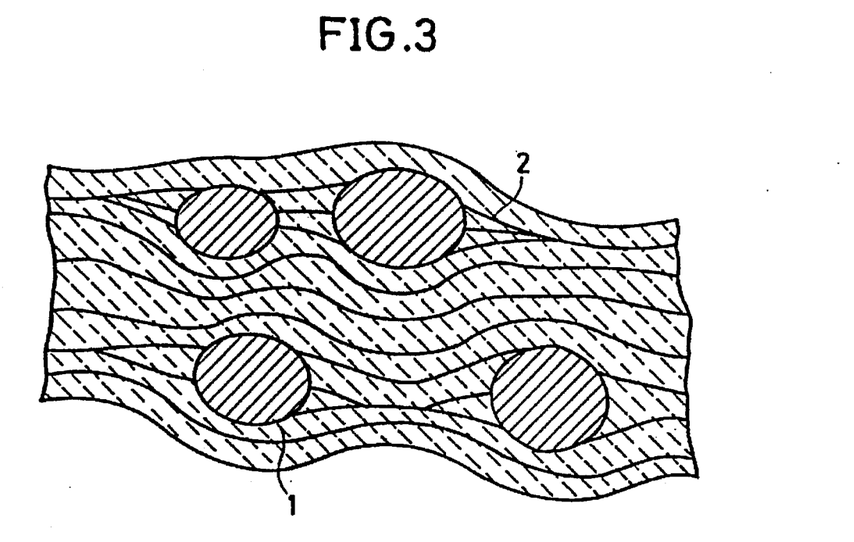
FIG. 3 typically illustrates states of superconducting phases and non-supercondUcting phases in a superconductor exhibiting relatively low critical current density in Example III.

Crystal states of the superconducting wires according to Examples III-1 and III-2 were observed by SEM and EDX. FIG. 2 typically illustrates the crystal state of the superconducting wire of Example III-1. FIG. 3 typically illustrates the crystal state of the superconducting wire of Example III-2. As clearly understood from FIG. 2, it has been recognized that non-superconducting phases 1 were mixed with superconducting phases 2 in thin layer states in the direction of crystal orientation, i.e., along a and b axes in the superconductor of Example III-1. In the superconductor of Example III-2 shown in FIG. 3, on the other hand, non-superconducting phases 1 disarranged orientation of superconducting phases 2 to prevent smooth current flow.

EXAMPLE IV

Example of a third embodiment of the present invention is now described.

Commercially available powder materials (99.9 to 99.99% in purity) of $Bi_2O_3$, PbO, $SrCO_3$, $CaCO_3$ and CuO of about 1 μm in average particle size were mixed in the ratios 1.8:0.4:2:2.5:3 and subjected to calcination and sintering. Calcination was performed at a temperature of 800° C. for periods shown in the column of "calcination time" in "preparation of powder" in Table 3, while sintering was performed at a temperature of 860° C. for periods shown in the column of "sintering time" in "preparation of powder" in Table 3. Thus, samples (Example IV-1 to IV-4) mainly formed of 80 K phases and reference samples (Reference Example IV-1 and IV-2) mainly formed of 110 K phases were prepared. It was possible to identify these phases by X-ray diffraction. In a diffraction pattern using Cu-Kα, for example, peaks of the K phases were observed at about 5.7° (2θ) and those of the 110 K phases were observed at about 4.7° (2θ).

Powder samples obtained by pulverizing the aforementioned respective sintered bodies were charged in silver sheaths of 6 mm in outer diameter and 4 mm in inner diameter, and worked into element wires of 0.64 mm in diameter by swaging and wire drawing.

These element wires were worked into tape-type wires of 0.25 mm in thickness by rolling, sintered at 840° to 845° C. for 100 hours, subjected to cold rolling to be 0.12 mm in thickness, and then sintered at 840° to 845° C. for 50 hours.

Table 3 also shows critical temperatures $T_C$ [K] and critical current density values $J_C$ [A/cm²] at 77.3 K of the samples thus obtained.

EXAMPLE V

Example of a fourth embodiment of the present invention is now described.

$Bi_2O_3$, PbO, $SrCO_3$, $CaCO_3$ and CuO were employed to prepare powder containing Bi, Pb, Sr, Ca and Cu in composition ratios 1.8:0.4:2:2.2:3.

This powder was charged in a silver pipe of 4 mm in inner diameter and 6 mm in outer diameter, drawn into a wire of 1.6 mm in diameter, subjected to cold rolling to be 0.2 mm in thickness, and subjected to first heat treatment under respective conditions shown in Table 4.

Thereafter respective samples V-1 to V-8 were subjected to cold rolling to be 0.14 to 0.17 mm in thickness, and subjected to second heat treatment at 845° C. for 50 hours.

TABLE 3

|  |  |  | Preparation of Powder | | | |
|---|---|---|---|---|---|---|
|  | No. | Main Phase | Calcination Time | Sintering Time | Tc [K] | Jc [A/cm²] |
| Example | IV-1 | 80 K phase | 8 | 20 | 103 | 10200 |
|  | IV-2 | " | 16 | 8 | 106 | 9500 |
|  | IV-3 | " | 20 | 12 | 104 | 10400 |
|  | IV-4 | " | 24 | 8 | 104 | 9800 |
| Reference | IV-1 | 110 K Phase | 20 | 200 | 104 | 2140 |
| Example | IV-2 | " | 20 | 400 | 105 | 3270 |

TABLE 4

|  | No. | Condition of 1st Heat Treatment | High-Temperature Phase | Critical Current Density (A/cm², 77.3 K) |
|---|---|---|---|---|
| Reference Example | V-1 | 845° C. × 10 min. | none | 1320 |
|  | V-2 | 845° C. × 30 min. | none | 1450 |
|  | V-3 | 845° C. × 5 h. | few | 1650 |
|  | V-4 | 845° C. × 10 h. | few | 3230 |
| Example | V-5 | 845° C. × 20 h. | about 50% | 7640 |
|  | V-6 | 845° C. × 50 h. | 100% | 16600 |
|  | V-7 | 845° C. × 100 h. | 100% | 17200 |
|  | V-8 | 845° C. × 200 h. | 100% | 16800 |

Table 4 shows characteristics of the respective samples thus obtained, particularly critical current density values under dipping in liquid nitrogen. High critical current density values were obtained in the samples V-5 to V-8, which were subjected to first heat treatment under conditions for generating high-temperature phases, i.e., conditions of at least "845° C. for 20 hours".

EXAMPLE VI

Example of a fifth embodiment of the present invention is now described.

Commercially available powder materials (99.9 to 99.99% in purity) of $Bi_2O_3$, PbO, $Sb_2O_3$, $SrCl_3$, $CaCO_3$ and CuO of about 1 μm in average particle size were mixed in composition ratios shown in Table 5. Such samples were calcined at 800° C. for 12 hours, pulverized, sintered at 800° C. for 18 hours and pulverized, and then charged in silver pipes of 12 mm in outer diameter and 8 mm in inner diameter, to be drawn into wires of 2 mm in diameter. These wires were subjected to cold rolling to form tapes of 0.4 mm in thickness, subjected to heat treatment at 840° C. for 50 hours, subjected to cold rolling to form tapes of 0.25 mm in thickness, and further subjected to heat treatment at 840° C. for 50 hours. In the two heat treatment steps at 840° C., the rates of cooling to 300° C. were controlled as shown in Table 5. Table 5 shows critical current density values at 77.3 K of the wires thus obtained.

EXAMPLE VII

Example of a sixth embodiment of the present invention is now described.

$Bi_2O_3$, PbO, $SrCO_3$, $CaCO_3$ and CuO were employed to prepare powder containing Bi, Pb, Sr, Ca and Cu in composition ratios 1.8:0.4:2:2.2:3.

Samples of this powder were sintered under "sintering conditions" shown in Table 6, in order of "No. 1", "No. 2" and "No. 3" in this Table. Sintering conditions of "No. 1" and "No. 2" were 8 to 12 hours, and those of "No. 3" were 12 to 24 hours. Sintering of "No. 1" and "No. 2" was performed under the atmospheric pressure, while sintering of "No. 3" was performed in the atmospheric air under parenthesized pressures in Table 6.

The respective samples sintered under the "sintering conditions" shown in Table 6 were charged in silver pipes of 4 mm in inner diameter and 6 mm in outer diameter, drawn into wires of 1 mm in diameter and rolled to be 0.5 mm in thickness. Then the respective samples were subjected to heat treatment at 845° C. for 50 hours, subjected to cold rolling to be varied in thickness, and subjected to heat treatment at 840° C. for 50 hours.

TABLE 5

|  | No. | Bi | Pb | Sb | Sr | Ca | Cu | Cooling Rate (°C./h.) | Critical Current Density (A/cm²) |
|---|---|---|---|---|---|---|---|---|---|
| Example | 1 | 1.8 | 0.4 | — | 2 | 2.2 | 3 | 180 | 12,400 |
|  | 2 | 1.8 | 0.4 | — | 2 | 2.0 | 3 | 180 | 10,800 |
|  | 3 | 1.7 | 0.4 | 0.1 | 2 | 2.2 | 3 | 180 | 11,000 |
|  | 4 | 1.8 | 0.4 | — | 2 | 2.3 | 3 | 190 | 13,900 |
|  | 5 | 1.8 | 0.4 | — | 2 | 2.3 | 3 | 230 | 14,400 |
|  | 6 | 1.8 | 0.4 | — | 2 | 2.3 | 3 | 200 | 14,300 |
|  | 7 | 1.9 | 0.4 | — | 2 | 2.2 | 3 | 180 | 13,600 |
|  | 8 | 1.9 | 0.4 | — | 2 | 2.2 | 3 | 170 | 12,400 |
|  | 9 | 1.8 | 0.4 | 0.1 | 2 | 2.2 | 3 | 190 | 11,700 |
|  | 10 | 1.8 | 0.4 | 0.05 | 2 | 2.2 | 3 | 190 | 11,900 |
|  | 11 | 1.6 | 0.4 | — | 2 | 2.2 | 3 | 180 | 8,700 |
|  | 12 | 1.6 | 0.4 | — | 2 | 2.2 | 3 | 210 | 9,600 |
| Reference Example | 13 | 1.8 | 0.4 | — | 2 | 2.2 | 3 | 50 | 3,200 |
|  | 14 | 1.8 | 0.4 | — | 2 | 2.0 | 3 | 40 | 4,100 |
|  | 15 | 1.7 | 0.4 | 0.1 | 2 | 2.2 | 3 | 60 | 2,800 |

Figure 4:
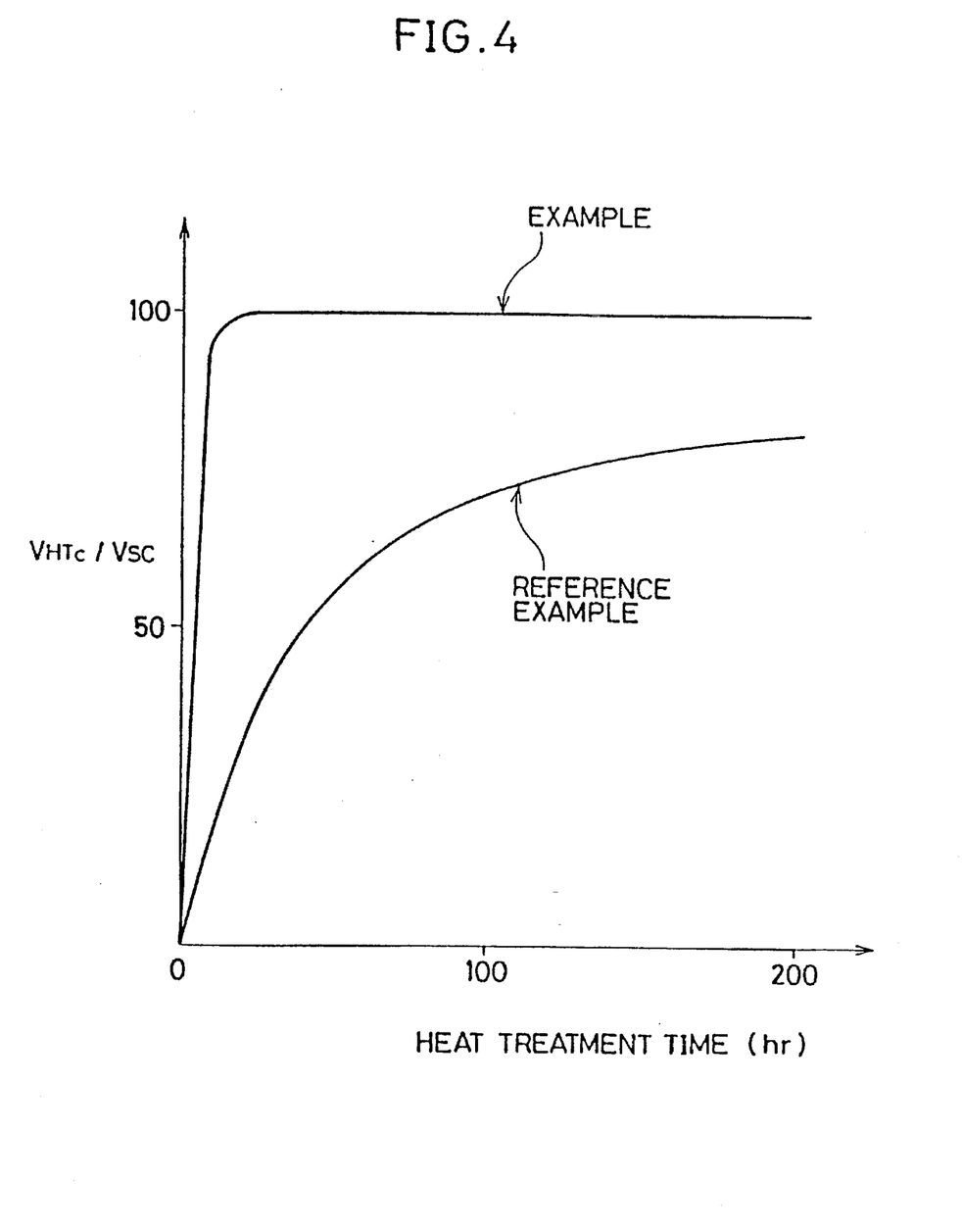
FIG. 4 illustrates relation between heat treatment times and volume ratios of high-temperature superconducting phases in Example VIII.

The respective samples thus obtained were dipped in liquid nitrogen, to be subjected to measurement of critical current density. At this time, the samples were provided in the form of wires of 50 cm in length, to also examine dispersion in critical current density per 10 cm. Table 6 also shows the results.

and once at 860° C. similarly to the above and performing heat treatment on such compacts at 860° C. with different times to attain oxide superconductor composition, and then magnetization were similarly measured to obtain volume ratios of high-temperature superconducting phases. FIG. 4 also shows the results of measurement. In this comparison, the heat treatment was performed at the temperature of 860°

TABLE 6

| Sample No. | Sintering Conditions | | | Final Thickness (mm) | Critical Current Density (A/cm$^2$) | Dispersion in Critical Current Density |
|---|---|---|---|---|---|---|
| | No. 1 | No. 2 | No. 3 | | | |
| 1 | 750° C. | 800° C. | 760° C. (1 Torr) | 0.45 | 8060 | ±3% |
| 2 | 740° C. | 810° C. | 770° C. (1 Torr) | 0.40 | 7640 | ±2% |
| 3 | 750° C. | 810° C. | 760° C. (1 Torr) | 0.43 | 8630 | ±3% |
| 4 | 750° C. | 790° C. | 770° C. (1 Torr) | 0.48 | 9010 | ±2% |
| 5 | 740° C. | 800° C. | 760° C. (1 Torr) | 0.39 | 7550 | ±2% |
| 6 | 740° C. | 840° C. | 810° C. (1 Torr) | 0.45 | 8470 | ±2% |
| 7 | 750° C. | 820° C. | 790° C. (1 Torr) | 0.43 | 8290 | ±3% |
| 8 | 750° C. | — | 780° C. (1 Torr) | 0.42 | 3230 | ±5% |
| 9 | 760° C. | 840° C. | — | 0.43 | 4390 | ±44% |

As clearly understood from Table 6, oxide superconducting wires having high critical current density values with substantially no scattering over the longitudinal directions were obtained according to the sixth embodiment. Referring to Table 6, samples Nos. VII-1 to VII-8 are within the scope of the sixth embodiment, while the sample No. VII-9 is out of the scope of this embodiment. Although the sample No. VII-9, which is out of the scope of the sixth embodiment, has a high critical current density value as compared with the sample No. VII-8, which is within the scope of this embodiment, scattering in critical current density must be noted. The sample No. VII-9 exhibits extremely high scattering of 44% in critical current density.

EXAMPLE VIII

Description is now made on Example with respect to employment of a metal sheath, which is assumed to be a preferable embodiment of the present invention.

Oxide powder materials were mixed so that Bi, Pb, Sr, Ca and Cu were in the ratios 0.8:0.2:1:1:2, and this mixed powder was temporarily sintered twice at 800° C. and once at 860° C. The temporarily sintered powder was charged in a metal sheath of silver, serving as a covering member, and worked into a wire of 0.3 mm in diameter by drawing, swaging and pressing.

Samples of the wire thus covered with silver were subjected to heat treatment at 845° C. with different heat treatment times, to attain oxide superconductor composition within the same. After the heat treatment, the silver sheaths were peeled off from the respective wires and magnetization were measured thereby to obtain volume ratios $V_{HTC}/V_{SC}$ ($V_{HTC}$: volume of high temperature superconducting phases, $V_{SC}$: full volume of superconducting phases) of high-temperature superconducting phases in the oxide superconductors. FIG. 4 shows the results.

Reference samples were prepared by pressing powder materials subjected to temporary sintering twice at 800° C.

C. since oxide superconductor composition cannot be attained in the compacts thus pressed if the heat treatment temperature is 845° C.

As clearly understood from FIG. 4, the samples covered with the silver sheaths and subjected to heat treatment were singularized in phase with only high-temperature superconducting phases within about 10 hours. On the other hand, the reference samples subjected to heat treatment with no covering were not making into single phase of a high-Tc even if the heat treatment was performed for 200 hours.

Figure 5:
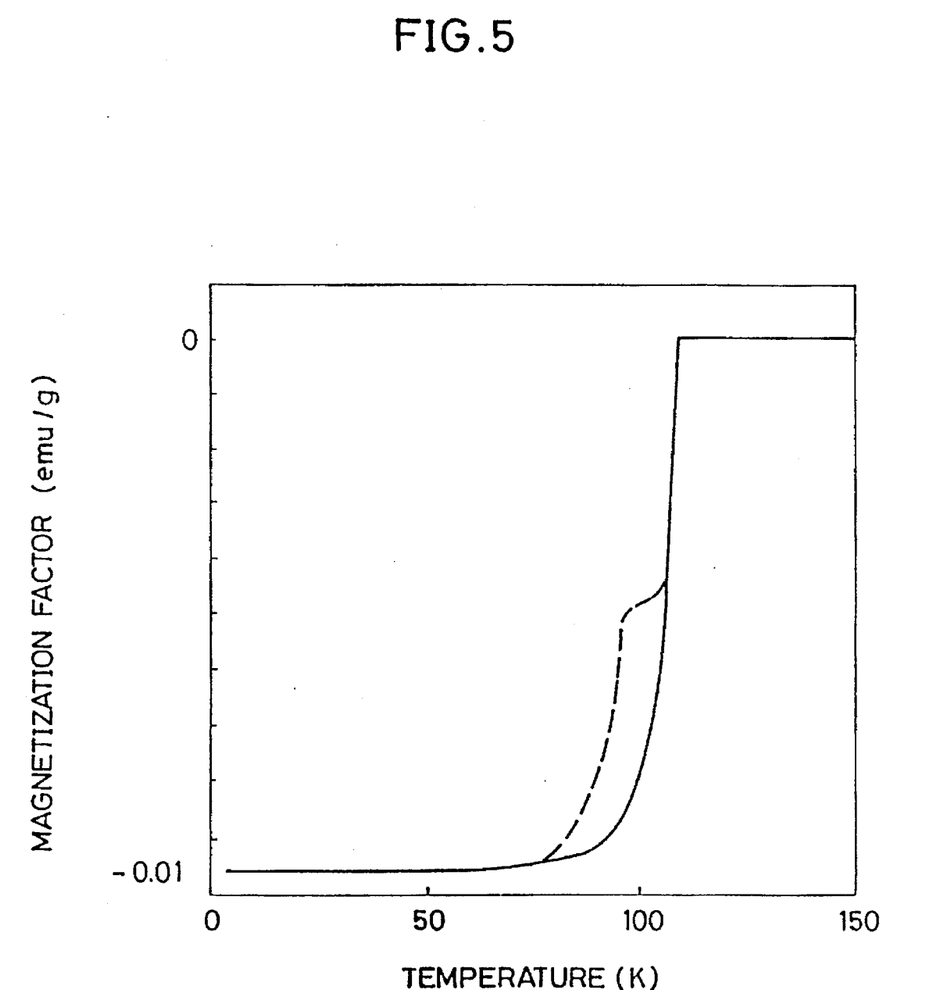
FIG. 5 illustrates relation between magnetization factors and temperatures in an oxide superconductor obtained in Example VIII.

A sample subjected to heat treatment for 24 hours in the method of the aforementioned embodiment was separated from the silver sheath and subjected to measurement of critical current density in liquid nitrogen (77.3 K) by the four terminal method. The result was 1850 A/cm$^2$. Reduction of electrical resistance was started at a temperature Tc$_{onset}$ of 110 K, and electrical resistance was completely lost at a temperature of 104 K. FIG. 5 shows relation between magnetization factors and temperatures in a solid line. FIG. 5 also shows the result in a Bi-Pb-Sr-Ca-Cu oxide superconductor prepared by a conventional method in a dotted line. It is understood from FIG. 5 that, dissimilarly to the conventional one, no shoulder was developed in the oxide superconductor obtained according to this embodiment, which was made into single phase substantially with only high-temperature superconducting phases.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing an oxide superconducting material of Bi-Pb-Sr-Ca-Cu by thermally treating raw material, said method consisting essentially of the steps of:

providing a raw material;

preparing said raw material, thereby generating superconducting phase crystals having a low critical temperature;

charging said raw material in a metallic sheath;

performing first plastic deformation on said sheath and raw material;

performing first heat treatment on said sheath and raw material after being subjected to said first plastic deformation, thereby transforming the low temperature superconducting phase crystals contained in said material into high temperature superconducting phase crystals;

performing second plastic deformation on said sheath and material after being subjected to said first heat treatment, thereby arranging a-b planes of said high temperature superconducting phase crystals parallel to a longitudinal axis of said sheath; and performing second heat treatment on said sheath and material after being subjected to said second plastic deformation, thereby strengthening bonding between said high temperature superconducting phase crystals.

2. A method of producing an oxide superconductor in accordance with claim 1, wherein said oxide superconductor of Bi-Pb-Sr-Ca-Cu is composed of:

$$Bi_{z_1-x}Pb_xSr_{z_2}Ca_{z_3}Cu_y$$

where x, y, $z_1$, $z_2$ and $z_3$ represent numbers satisfying $0.2 \leq x \leq 0.8$, $1.5 \leq z_1, z_2, z_3 \leq 3.0$ and $2.5 \leq y \leq 4.5$, and oxygen.

3. A method of producing an oxide superconductor in accordance with claim 1, wherein said oxide superconductor of Bi-Pb-Sr-Ca-Cu is composed of:

$$Bi_aPb_bSr_cCa_dCu_e$$

where a, b, c, d and e represent numbers satisfying a+b:c:d:e=1.7 to 2.8:1.7 to 2.5:1.7 to 2.8:3, and oxygen.

4. A method of producing an oxide superconductor of Bi-Pb-Sr-Ca-Cu by thermally treating raw material, said method consisting essentially of the steps of:

providing a raw material;

preparing said raw material, thereby generating superconducting phase crystals having a low critical temperature;

charging said raw material in a metallic sheath;

performing first plastic deformation on said sheath and raw material;

performing first heat treatment on said sheath and raw material after being subjected to said first plastic deformation within a temperature range of about 840° to 845° C., thereby transforming the low temperature superconducting phase crystals contained in said material into high temperature superconducting phase crystals;

performing second plastic deformation on said sheath and material after being subjected to said first heat treatment, thereby reducing the cross sectional area of said sheath and material by at least 10% and arranging a-b planes of said high temperature superconducting phase crystals parallel to a longitudinal axis of said sheath; and performing second heat treatment on said sheath and material after being subjected to said second plastic deformation within a temperature range about 840° to 845° C., thereby strengthening bonding between said high temperature superconducting phase crystals.

5. A method of producing an oxide superconductor in accordance with claim 4, wherein said metal sheath is formed of one silver and a silver alloy.

6. A method of producing an oxide superconductor in accordance with claim 4, wherein said plastic deformation is one of rolling, pressing and wire drawing.

7. A method of producing an oxide superconductor in accordance with claim 4, wherein said oxide superconductor of Bi-Pb-Sr-Ca-Cu is composed of:

$$Bi_{z_1-x}Pb_xSr_{z_2}Ca_{z_3}Cu_y$$

where x and y represent numbers satisfying $0.2 \leq x \leq 0.8$ and $2.5 \leq y \leq 4.5$, and oxygen.

8. A method of producing an oxide superconductor of Bi-Pb-Sr-Ca-Cu by thermally treating raw material, said method consisting essentially of the steps of:

providing a raw material;

preparing said raw material, thereby generating superconducting phase crystals;

charging said raw material in a metallic sheath;

performing first plastic deformation on said sheath and raw material;

performing first heat treatment on said sheath and raw material after being subjected to said first plastic deformation;

cooling said sheath and material after being subjected to said first heat treatment to 300° C. at a rate of at least 100° C./h;

performing second plastic deformation on said sheath and material after being subjected to said cooling step, thereby arranging a-b planes of said high temperature superconducting phase crystals parallel to a longitudinal axis of said sheath;

performing second heat treatment on said sheath and material after being subjected to said second plastic deformation, thereby strengthening bonding between said superconducting phase crystals; and cooling said sheath and material after being subjected to said second heat treatment to 300° C. at a rate of at least 100° C./h.

9. The method of producing an oxide superconductor in accordance with claim 8, wherein said first heat treatment and said second heat treatment are performed at temperatures of 800° to 860° C.

10. The method of producing an oxide superconductor in accordance with claim 8, wherein said cooling steps are performed within a temperature range of up to about 500° C. at a rate of at least 150° C./h.

11. The method of producing an oxide superconductor in accordance with claim 8, wherein said cooling steps are forcibly performed.

12. A method of producing an oxide superconductor in accordance with claim 8, wherein said oxide superconductor of Bi-Pb-Sr-Ca-Cu contains antimony.

13. A method of producing an oxide superconductor of Bi-Pb-Sr-Ca-Cu by thermally treating raw material, said method comprising the steps of:

providing a raw material;

preparing raw material from powder which is sintered under an atmosphere of from about 0.1 to about 10 Torr, thereby generating superconductor phase crystals;

charging said raw material in a metal sheath;

performing first plastic deformation on said sheath and raw material charged in said metal sheath;

performing first heat treatment on said sheath and raw material after being subjected to said first plastic deformation within a temperature range of 780° to 860° C.;

cooling said sheath and material after being subjected to said first heat treatment to about 300° C. at a rate of at least 100° C./h.;

performing second plastic deformation on said sheath and material after said cooling step by applying a load of at least 1 ton/cm² thereby arranging a-b planes of said high temperature superconducting phase crystals parallel to a longitudinal axis of said sheath;

performing second heat treatment on said sheath and material after being subjected to said second plastic deformation, thereby strengthening bonding between said superconducting phase crystals; and cooling said sheath and material being subjected to said second heat treatment to at least about 300° C. at a rate of at least 100° C./h.

14. A method of producing an oxide superconductor of Bi-Pb-Sr-Ca-Cu by thermally treating raw material, said method comprising the steps of:

providing a raw material;

preparing said raw material, thereby generating superconducting phase crystals having a low critical temperature;

charging said raw material in a metallic sheath;

performing first plastic deformation by performing at least one of rolling and pressing on said sheath and raw material charged in said sheath, thereby forming said sheath and raw material into a tape and increasing density of said material;

performing first heat treatment on said tape within a temperature range of about 840° C. to 845° C., thereby transforming the low temperature superconducting phase crystals contained in said material into high temperature superconducting phase crystals cooling said tape;

performing second plastic deformation on said tape thereby reducing the cross sectional area of at least 10% by performing at least one of rolling and pressing on said material after said cooling step, thereby further increasing the density of said material; and performing second heat treatment on said tape after being subjected to said second plastic deformation within a temperature range of about 840° C. to 845° C. thereby strengthening bonding crystal between said superconducting phase crystals.

15. The method of producing an oxide superconductor according to claim 14, wherein said cooling is performed to at highest 300° C.

16. The method of producing an oxide superconductor according to claim 15, wherein said cooling step is performed at a cooling rate of at least 100° C./h.

17. The method of producing an oxide superconductor according to any one of claims 14, 15, or 16, wherein said second plastic deformation is performed by applying a load of at least 0.98 N/m².

* * * * *